United States Patent [19]

Yeap et al.

[11] Patent Number: 5,740,407
[45] Date of Patent: Apr. 14, 1998

[54] METHOD OF GENERATING POWER VECTORS FOR CIRCUIT POWER DISSIPATION SIMULATION HAVING BOTH COMBINATIONAL AND SEQUENTIAL LOGIC CIRCUITS

[75] Inventors: Gary Yeap, Gilbert; Alberto Reyes, Phoenix; Sean Tyler, Chandler, all of Ariz.

[73] Assignee: Motorola, Inc., Schaumburg, Ill.

[21] Appl. No.: 498,454

[22] Filed: Jul. 5, 1995

[51] Int. Cl.$^6$ .............................. G06F 9/455; G06F 17/50
[52] U.S. Cl. .................. 395/500; 364/221.2; 364/232.3; 364/275.6
[58] Field of Search ....................... 395/500; 364/578, 364/488-491

[56] References Cited

U.S. PATENT DOCUMENTS

| | | | |
|---|---|---|---|
| 5,481,469 | 1/1996 | Brasen et al. | 364/483 |
| 5,504,694 | 4/1996 | George et al. | 364/514.12 |
| 5,553,008 | 9/1996 | Huang et al. | 364/578 |

*Primary Examiner*—Kevin J. Teska
*Assistant Examiner*—Ayni Mohamed
*Attorney, Agent, or Firm*—Gary W. Hoshizaki; Sharon K. Coleman

[57] ABSTRACT

A method of generating power vectors to calculate power dissipation for a circuit is provided. The circuit includes both combinational logic and sequential logic circuits. The method includes removing all sequential logic circuits from the circuit. Boolean equations that describe the logical operation of the combinational logic of the circuit cells are generated. Power vectors are generated from the Boolean equations corresponding to internal and output transitions which dissipate power in the circuit. Redundant power vectors are then eliminated. The power vectors are then analyzed for "consistent" behavior with the sequential logic circuits. Operation of sequential logic circuits follow an ordered or defined sequence of events. Power vectors that are "inconsistent" with the operation of the sequential logic circuits are eliminated. The remaining power vectors are used to simulate the power dissipation of the circuit.

13 Claims, 3 Drawing Sheets

METHOD OF GENERATING POWER VECTORS FOR CIRCUIT POWER DISSIPATION SIMULATION HAVING BOTH COMBINATIONAL AND SEQUENTIAL LOGIC CIRCUITS

CROSS REFERENCE TO RELATED PATENT APPLICATIONS

The present application is related to copending U.S. patent application Ser. No. 08/254,831, now abandoned, Attorney's Docket SC08766S, entitled "METHOD FOR GENERATING POWER VECTORS FOR CELL POWER DISSIPATION SIMULATION", filed Jun., 06, 1994, by "Alberto Reyes, Gary Yeap, and James Garvey" and assigned to the same assignee, Motorola Inc. and to copending U.S. patent application Ser. No. 08/141,368, and now U.S. Pat. No. 5,504,694 Attorney's Docket SC08543S, entitled "A METHOD OF CELL CHARACTERIZATION ENERGY DISSIPATION", filed Oct. 28, 1993, by "Binay George, Markus Wloka, and Sean Tyler" and assigned to the same assignee, Motorola Inc.

BACKGROUND OF THE INVENTION

The present invention relates in general to automated integrated circuit design and, more particularly, to a method of simulating power dissipation in an integrated circuit.

Advances in semiconductor technology have made commonplace the manufacture of high capacity, high density integrated circuits (ICs) in the range of a million or more transistors. Digital circuits such as microprocessors are examples of such high capacity, high density ICs. Power consumption and heat dissipation become major concerns in circuits with such a large number of transistors. In order to deal with the heat dissipation problem circuit designers continually look for more efficient ways to calculate an accurate estimate of the power consumption and adjust the design if necessary before the circuit is committed to manufacturing.

In the past, much of the effort in obtaining the estimated power consumption of the IC has been done by computer simulations. SPICE circuit simulations are one example of such computer modeling. While SPICE simulation is accurate, it is also very time consuming. In order to set up a SPICE simulation, the designer must develop a transistor level netlist, ascertain the necessary input vectors, and determine the proper SPICE model for the elements in the netlist.

The predetermined set of input vectors are applied to inputs of the IC while it is monitored for power consumption. One technique involves measuring the supply current sourced from the power supply conductors that power the IC. The measured supply current from a known voltage source over a known period of time provides a measure of power consumption. The set of input signal vectors often becomes quite extensive to properly exercise the circuit. Moreover, many of the input signal vectors redundantly exercise components within the overall design, thereby adding to the simulation time. It is not uncommon for more complex simulations to take days to complete. Thus, many automated circuit simulators are limited to small circuit modeling because of the time consuming aspect of the task.

Hence, a need exists to accurately and rapidly estimate power consumption in an IC using a minimal set of input vectors.

DETAILED DESCRIPTION OF THE PREFERRED EMBODIMENT

Figure 1:
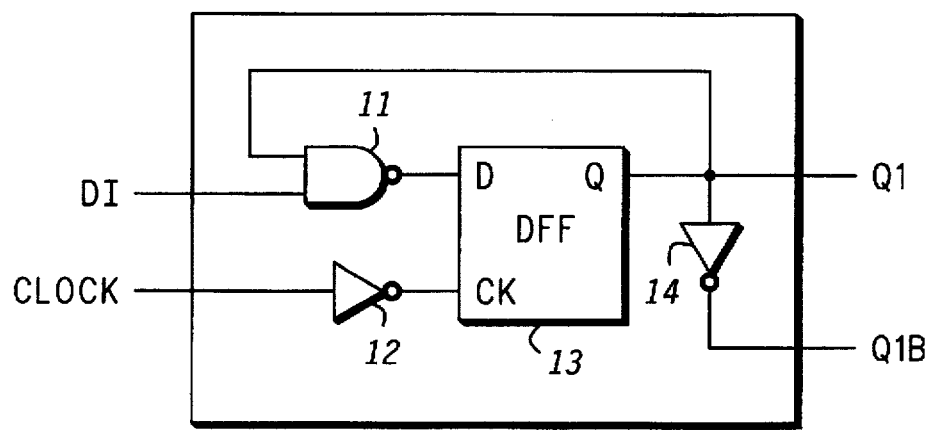
FIG. 1 is a schematic diagram of a circuit having combinational and sequential logic circuitry.

Power dissipation has been identified as a major concern in the design of low-power Very Large Scale Integrated (VLSI) Circuits. In the past, much of the effort in predicting power dissipation of a circuit utilized a transistor level simulation program such as SPICE. SPICE is a public domain circuit simulation program well known in the art. Transistor level circuit simulation is extremely time consuming and computer intensive since it relies on a detailed electrical model. It is also a very accurate form of simulation. Transistor level simulation involving millions of digital logic gates would require such a large amount of computer memory that it would make power estimations of a circuit impractical. In order to speed up the power estimation process, power computation techniques that use logic level simulation are better suited for VLSI circuits. A logic level simulation is a functional simulation of a circuit. The advantage of logic level simulation is that power dissipation is predicted from a simulation of the entire chip within a reasonable period of time.

Power dissipation in CMOS logic circuits is principally due to three main components; (1) charging and discharging of capacitive loads, (2) short circuit current, and (3) leakage current. The majority of power dissipation is attributable to the first two components and commonly referred to as dynamic power dissipation. The power dissipation is caused by signal transitions occurring at the input and output terminals and internal nodes of the logic gates that comprise the digital circuit. A smaller fraction of power consumption, referred to as static power dissipation, is due to leakage current under static logic states. Both dynamic and static power dissipation can be measured by simulating the digital circuit and making power measurements. The simulation is typically performed by applying an appropriate set of input logic vectors that cause power dissipation, called power vectors, to the input terminals of the digital circuit. For example, (0, 1, r) is a power vector where the first input is at a fixed logic zero level, the second input is at a fixed logic one level and the third input switches or transitions from a 0 to 1 (denoted by symbol "r" for rising). Conversely, a symbol f denotes a falling transition from a 1 to 0.

An arbitrary set of logic switching signals does not constitute a valid dynamic power vector of a circuit because input switching of the circuit does not necessarily cause dynamic power dissipation. A simple example of this is a two input AND gate having one input at a logic zero level. No dynamic power dissipation occurs when the other input transitions from a 0-1 or 1-0 since the output remains at a logic zero level. Conversely, an input of the AND gate at a logic one level has two dynamic power vectors (1,r) and (1,f) which respectively has the output of the AND gate transitioning from a 0-1 and a 1-0. The output transition of the AND gate constitutes a charging or discharging of a capacitance which causes power dissipation.

A first step to calculate power dissipation through a logic level simulation is to determine a complete set of valid dynamic power vectors for a circuit. If a library of circuits is being generated then each circuit of the library is characterized. The dynamic power vectors produce all transitions within the circuit and at the outputs of the circuit. A dynamic power characterization is run on a circuit after a set of dynamic power vectors has been generated. A dynamic power characterization executes a transistor level simulation (such as SPICE) on the circuit utilizing the dynamic power vectors (applied to the inputs of the circuit) to trigger power dissipating logic level transitions. The energy associated with the switching or transitions within the circuit and at the output of the circuit are measured and stored in a database.

In general, a circuit is formed from a library of sub-circuits, also known as cells, that have been characterized for power dissipation. A power dissipation calculation can be performed on a logic level simulation of the circuit. Each input and output of each cell in the circuit is monitored. The cells of the circuit are monitored for switching activity that matches the dynamic power vectors of each cell. If a match occurs the energy associated with the vector and the cell (calculated previously via a transistor level simulation) is accumulated. Note that the energy values and dynamic power vectors are stored in an accessible database to the logic simulation program. The power dissipation of the circuit is the sum of all energy values divided by the time elapsed in the logic simulation. The procedure is a reliable method to predict the dynamic power dissipation of a digital circuit which greatly reduces simulation time. The results are accurate due to the use of transistor level simulation data on the power dissipation of each cell.

As mentioned previously, a logic level simulation for calculating power dissipation is performed. The set of dynamic power vectors is an input vector set that produce logic level transitions which dissipate power within a circuit. A set of dynamic power vectors is unique to a circuit. How to generate the complete set of dynamic power vectors for different types of circuits is a problem. In particular, the generation of dynamic power vectors containing both sequential logic circuitry and combinational logic circuitry can be difficult due to the different operating characteristics of each circuit type.

In general, many digital logic circuits being developed are a mixture of two different types of circuits. A first type of digital logic circuit is a combinational logic circuit or random logic circuits. Combinational logic circuits comprise elements such as NAND gates, NOR gates, AND gates, OR gates, and inverters. A combinational logic circuit can be expressed as a Boolean function.

A second type of digital logic circuit is a sequential logic circuit. An example of a sequential logic circuit is a latch or flip flop. Sequential logic circuits typically have a memory element, are clocked, and follow a "defined" input/output sequence. For example, a D-flip flop has an input, a clock input, an output, and set/reset inputs. A data storage sequence includes receiving and storing data during a low phase of a clock cycle and outputting stored data during a high phase of the clock cycle. An example of an "undefined" logic sequence, one that cannot occur in the normal course of operation is an output transition during a low phase of the clock cycle. The output of a D-flip flop transitions only during the high phase of the clock cycle. A sequential logic circuit cannot be expressed as a Boolean function.

A method for efficiently generating dynamic power vectors for a circuit having both combinational and sequential logic circuitry is disclosed herein. The method includes removing the sequential logic circuitry from a circuit and generating a set of dynamic power vectors for the remaining combinational logic circuitry in the circuit. The dynamic power vectors for the combinational logic circuitry is then pruned of vectors that are "inconsistent" to the operation of the sequential logic. The remaining dynamic power vectors are "consistent" and form a set of vectors that can be used to identify power dissipation in the circuit.

The method is best described by example. FIG. 1 is a circuit having both combinational and sequential logic circuitry. The circuit comprises a NAND gate 11, an inverter 12, a D-flip flop 13, and an inverter 14. Although the circuit is extremely simple it will illustrate the basic principles in generating dynamic power vectors that apply to a circuit having any number of gates.

NAND gate 11 has a first input coupled to an input DI of the circuit, a second input coupled to a Q1 output of the circuit, and an output. Inverter 12 has an input coupled to a CLOCK input of the circuit and an output. D-flip flop 13 has a D-input coupled to the output of NAND gate 11, a clock input CK coupled to the output of inverter 12, and a Q output coupled to the Q1 output of the circuit. Inverter 14 has an input coupled to the Q output of D-flip flop 13 and an output coupled to a Q1B output of the circuit.

Figure 2:
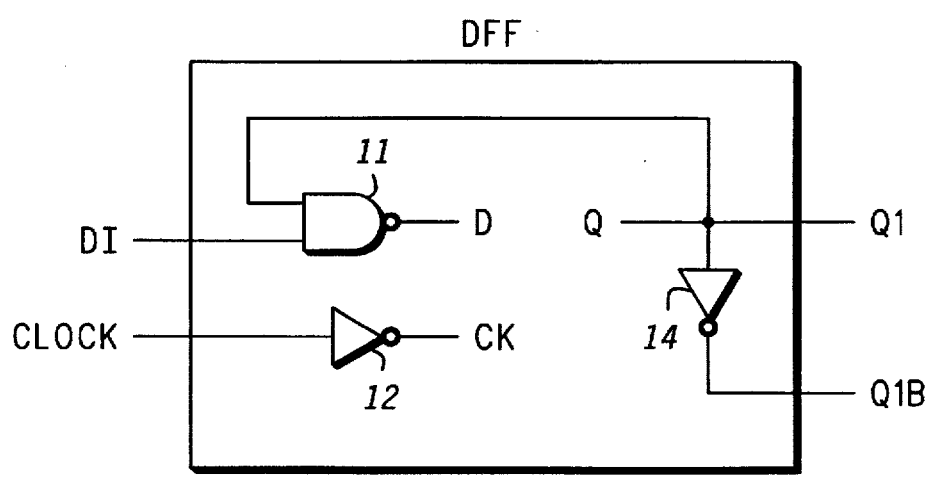
FIG. 2 is a schematic diagram of the circuit of FIG. 1 with the sequential logic circuitry removed in accordance with the present invention.

FIG. 2 is the circuit of FIG. 1 with D-flip flop 13 (sequential logic circuitry) removed. The sequential logic circuitry is removed leaving combinational logic circuitry NAND gate 11 and inverters 12 and 14. The D and CK inputs of D-flip flop 13 are treated as outputs of the combinational logic network which respectively correspond to the output of NAND gate 11 and the output of inverter 12. The Q output of D-flip flop 13 is treated as an input of the combinational logic network which corresponds to the second input of NAND gate 11 and the input of inverter 14.

The dynamic power vectors for the combinational logic shown in FIG. 2 are generated. The simplest method for generating power vectors is to exhaustively simulate the combinational logic for every input vector combination. The internal nodes and outputs of the remaining combinational logic are monitored for logic level transitions for each input vector. Input vectors that do not cause logic level transitions which dissipate power are eliminated. An exhaustive approach is not efficient for circuits having a large number of input vectors.

Figure 3:
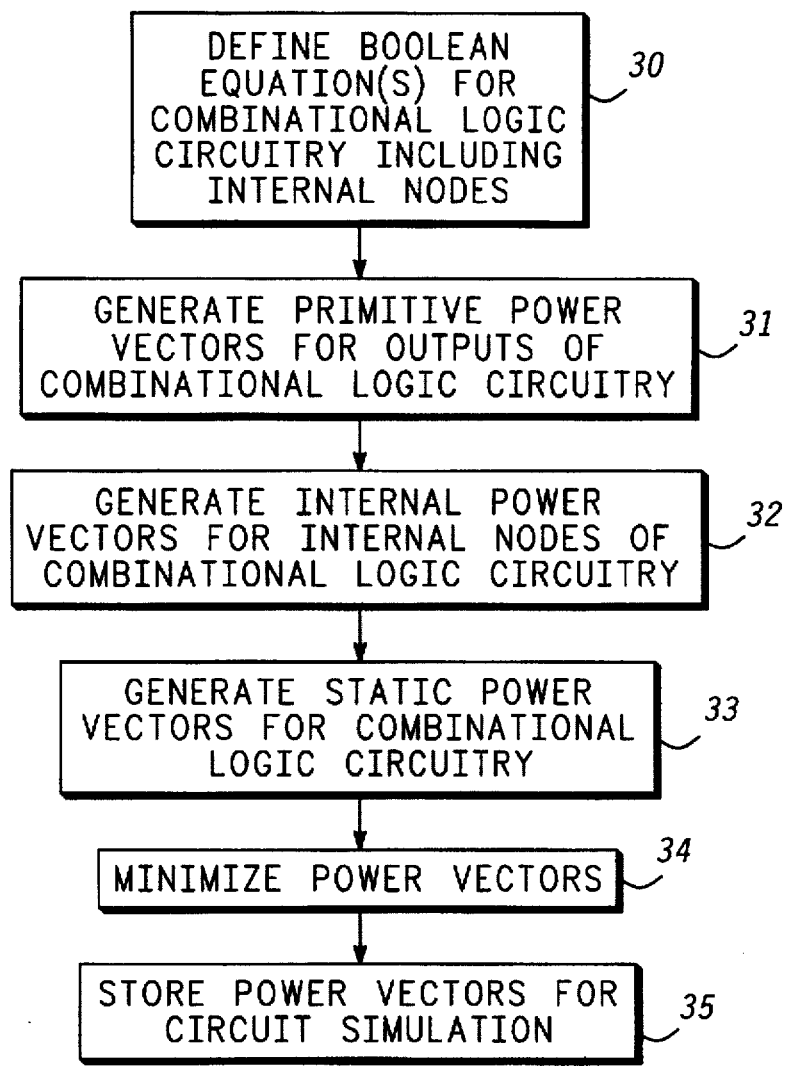
FIG. 3 is a flow diagram illustrating how power vectors of a combinational logic circuit are generated.

In the preferred embodiment, an efficient method for generating power vectors is to define the combinational logic as Boolean equations. The steps required to generate the power vectors from the Boolean equations are shown in FIG. 3. The steps are performed in computer software such that a minimal, yet complete and error-free set of power vectors are provided for a combinational logic circuit. Referring back to FIG. 2, the remaining combinational logic of the circuit of FIG. 1 is used to describe the process of generating power vectors as illustrated in FIG. 3. The combinational logic circuit of FIG. 2 includes NAND gate 11, inverter 12, and inverter 14.

Referring back to FIG. 3, step 30 defines the Boolean equation that describes the logical operation of the cell under simulation, e.g. the remaining combinational logic circuitry of FIG. 2. The Boolean algebraic expression for logic cell of FIG. 2 is D=$\overline{DI*Q}$, CK=$\overline{CLOCK}$, and Q1B=$\overline{Q}$ where DI, CLOCK, and Q are input signals to the circuit of FIG. 2. The signals D and CK are internal signals to the circuit. A more complex cell may include a number of individual Boolean equations describing an interrelated series of sub-functions that in the aggregate describe the overall operation of the circuit. The Boolean equation(s) must include all intermediate signals corresponding to internal nodes that may transition and therefore consume power but are not readily detectable from any input or output terminal of the circuit.

Step 31 generates primitive power vectors for a combinational circuit that cause power consumption at the output terminals as the output signals of the circuit change state. Simple cells such as NAND gates, NOR gates, AND gate, OR gates, and inverters have dynamic power dissipation, i.e. total power consumption detectable at the output terminals, that can be completely exercised by the set of primitive power vectors. The primitive power vectors are a subset of the total power vector set of a combinational logic circuit.

In general, a primitive power vector is a power vector which has one input transition that causes a change in the output state of the circuit. The primitive power vectors can be obtained from the logic function of the circuit using Boolean Difference Calculus. Let the logic function computed by a simple single output combinational circuit be given by $y=F(x_1, x_2, \ldots, x_n)$, where $x_1, x_2, \ldots, x_n$ are input elements. The Boolean difference of y with respect to an input variable $x_i$, denoted as Bool_diff($y, x_i$), results in a new Boolean function and is defined as the exclusive-OR ($\oplus$) of the function y with $x_i$ set to 0 and the function y with $x_i$ set to 1. Consider $y=f(x_1, \ldots, x_{i-1}, x_i, x_{i+1}, \ldots, x_n)$ as follows:

$$\text{Bool\_diff}(y, x_i) = f(x_1, \ldots, x_{i-1}, 0, x_{i+1}, \ldots, x_n) \oplus f(x_1, \ldots, x_{i-1}, 1, x_{i+1}, \ldots, x_n) \quad (1)$$

If for example $y=x_1 \cdot x_2$, then $$\text{Bool\_diff}(y, x_1) = (0 \cdot x_2) \oplus (1 \cdot x_2) \quad (2)$$
$$= 0 \oplus x_2 = x_2$$
$$\text{Bool\_diff}(y, x_2) = (x_1 \cdot 0) \oplus (x_1 \cdot 1) \quad (3)$$
$$= 0 \oplus x_1 = x_1$$

Note that the Bool_diff($y, x_i$) is another Boolean function that does not include the variable $x_i$, and hence the Bool_diff($y, x_i$) is independent of the variable $x_i$. The Boolean difference of an output y with respect to $x_i$ gives crucial information regarding the transition propagation characteristics of input $x_i$ to the output y.

Let P be a power vector where only input signal $x_i$ switches. From the Boolean function(s) that describe the circuit, Bool_diff($y, x_i$) provides a new Boolean function as described above in equation (1). The power vector P is substituted into and evaluated by Bool_diff($y, x_i$) for the logic values of the variables $x_1, \ldots, x_n$, excluding $x_i$ since Bool_diff($y, x_i$) is independent of the variable $x_i$, to yield a function denoted as Bool_diff($y, x_i$)(P). Since power vector P has only one input switching, i.e. other inputs are fixed as logic zero or logic one, and that input is independent of Bool_diff($y, x_i$), then Bool_diff($y, x_i$)(P) must necessarily evaluate to a logic zero or logic one.

For example, when $y=x_1 \cdot x_2$, Bool_diff($y, x_1$)=$x_2$ as demonstrated above in equation (2). By substituting a given value of P=($x_1$=r, $x_2$=1), Bool_diff($y, x_1$)(P)=1 since Bool_diff($y, x_1$) is a function only of $x_2$. Alternately if P=($x_1$=r, $x_2$=0), then Bool_diff($y, x_1$)(P)=0 again due to the fact that Bool_diff($y, x_1$) is a function only of $x_2$.

When Bool_diff($y, x_i$)(P)=1, it can be shown mathematically that the transition of power vector P at $x_i$ propagates to the output y. When Bool_diff($y, x_i$)(P)=0, the transition of power vector P does not propagate to output y. From these properties, the primitive power vectors for a circuit implementing the function y can now be obtained. The primitive power vectors for an input $x_i$ switching are the power vectors P for which Bool_diff($y, x_i$)(P)=1. All power vectors P that result in Bool_diff($y, x_i$)(P)=1 is the desired set primitive power vectors.

To determine all primitive power vectors P that result in Bool_diff($y, x_i$)(P)=1, a function Bool_diff($y, x_i$) for each combination of y and $x_i$ is generated from the Boolean equation that describes the circuit. The resulting Bool_diff ($y, x_i$) function is expressed as sum-of-product terms. A logic 0 or 1 is assigned at each input (except the $x_i$ input) to make each product term evaluate to a logic one level and assign r or f at the differential input. The differential input is the one input that transitions. Each product term contributes to two dynamic power vectors.

Combinational logic circuits experience power dissipation at internal nodes as they transition from one logic state to another in response to a power vector. Some internal node activity does not necessarily result in an output transition and therefore may not be detected via an output terminal. For example, a clock signal applied to the CLOCK input of FIG. 2 does not produce any output transitions at the Q1B output, yet CK, an internal node of the circuit transitions with each clock signal transition. Therefore, primitive power vectors as described above do not account for power dissipation attributed to internal node activity that does not result in transitions at the output terminals of a circuit. Most combinational logic circuits require power vectors to exercise internal nodes. Step 32 generates internal power vectors that exercise internal nodes in a circuit without any activity being observed at the output terminals of the circuit. The combination of internal power vectors and primitive power vectors form a complete set of dynamic power vectors for exercising a circuit.

In general, some power vectors cannot be observed at an output of a circuit due to the signal encountering a blocked logical path. Yet, if such a power vector produces a transition at some internal node in the circuit some dynamic power is still dissipated that needs to be accounted for in a simulation. Power dissipation due to internal node transitions is more prevalent in larger circuits. Internal power vectors are generated to account for power dissipated at internal nodes of a circuit that do not cause a transition at a circuit output.

Let $z_1$ be a signal at an internal node of a circuit. Let the logic function of the circuit be $z_1=f1(x_1, x_2, \ldots, x_n)$ and the output function of the circuit be $y_1=f2(z_1, x_1, x_2, \ldots, x_n)$. To determine all internal power vectors P that result in Bool_diff($y, x_i$)(P)=0 and Bool_diff($z_1, x_i$)(P)=1, i.e. internal node transition of z1 does not cause the output y to transition, a function Bool_diff($z_1, x_i$) is generated for each internal node z1 and input $x_i$ from the Boolean equation that describes signal processing to that node. The power vectors that satisfy Bool_diff($z_1, x_i$)(P1)=1 and Bool_diff($y, x_i$)(P2)=0 are the internal power vectors sought. The set of power vectors P1 and P2 can be obtained from the procedures described in the previous paragraphs. The set of internal power vectors P is the intersection of power vector from P1 and P2.

Step 33 generates static power vectors for a circuit that cause static power dissipation. The static power vectors do not change state and include all possible input steady states of the circuit, i.e. all possible input binary combinations. For example, the combinational logic circuit of FIG. 2 has eight combinations for inputs DI, CLOCK, and Q1 sequentially running from (0,0,0), (0,0,1), (0,1,0), (0,1,1), (1,0,0), (1,0,1), (1,1,0), and (1,1,1).

The combination of primitive power vectors, internal power vectors, and static power vectors comprise the total set of power vectors that are used to measure power consumption in a circuit. Step 34 minimizes the total set of power vectors to ensure the set is complete, minimal, and non-redundant.

A minimization process reduces the number of power vectors by eliminating and/or combining redundant ones.

The power vectors derived from steps 31–33 of FIG. 3 are sorted. The sorting process places identical power vector adjacent to one another for easy comparison. Identical adjacent power vectors are eliminated. Logically equivalent power vectors, i.e. ones including don't care elements, can be merged using classical Boolean containment rules for individual input variables. For example, consider two power vectors P1 and P2 consisting of three input variables with $P_1=(r,1,x)$ and $P_2=(r,1,0)$. The third input variable in P1 is don't care and therefore is logically identical to $P_2$. Hence, power vector $P_1$ merges with $P_2$ to produce a single vector (r,1,x).

Steps 30–34 have defined the Boolean equation for a circuit and identified the minimal number of primitive, internal and static power vectors necessary to simulate power consumption of the circuit. Step 35 involves storing the power vector set in a database for later use in a circuit power dissipation simulation. Note that the power vector set generated through Boolean functions pertains to the remaining combinational logic circuitry of FIG. 2 and does not include modifications due to the sequential logic circuitry which was removed.

The set of power vectors generated for the combinational logic circuitry is now used in conjunction with the sequential logic circuitry. Sequential logic circuitry operates in a specific manner. For example, D-flip flop 13 of FIG. 1 has the dynamic power vectors listed in Table 1. D-flip flop 13 is an edge triggered flip flop memory element similar to other sequential circuit elements.

TABLE 1

| D | CK | Q |
|---|----|---|
| 0,r | r | 0,f |
| 1,f | r | 1,r |
| 0,1,r,f | f | 0,1 |
| 0,1,r,f | 0 | 0,1 |
| 0,1,r,f | 1 | 0,1 |

For conciseness, the signals separated by comas are interpreted to imply that any one of the signals can be used to construct a valid vector. For example, the first row of the table actually represent four vectors as follows: (D, CK, Q)=>(0,r,0), (0,r,f), (r,r,0), (r,r,f). The four vectors represent a condition where a rising edge occurs at the input CK and a logic zero level is loaded into the D input of the D-flip flop 13 of FIG.1. The input logic level prior to the rising edge of the CK signal is the value that is stored or loaded into D-flip flop 13. Both a static logic zero level (0) and a rising logic level (r) at the DI input implies a logic zero level preceded each input condition. The output Q has a final state of 0 when loading in a logic zero level thus either 0 or f is observed. The other vectors are similarly derived from Table 1. Table 1 expresses a set of vectors "consistent" with the operation of the memory element. In general, each type of sequential circuit used in a circuit is characterized for a set of power vectors that are consistent with its operation.

As stated previously, sequential logic circuitry of a circuit are removed and the remaining combinational logic circuitry is characterized for a set of power vectors that are used to calculate power dissipation. In the example described in FIG. 1 and 2, the D and CK pins of the sequential logic element (D-flip flop 13 of FIG. 1) are treated as circuit outputs of the remaining combinational circuit. The Q output of D-flip flop 13 is treated as an input of the combinational network. The power vector set generated for the combinational circuitry of the circuit may contain some power vectors that are not compatible or "inconsistent" with the operating characteristics of the sequential logic circuitry (D-flip flop 13). For example, the D, CK, and Q terminals of D-flip flop 13 are monitored for each power vector of the combinational logic circuitry of FIG. 2. The logic states of D, CK, and Q terminal for each power vector (of the combinational logic circuitry) is compared against a behavioral table or list which describes the vectors consistent with the operation of the D-flip flop. Power vectors which produce inputs and outputs that are not "consistent" with the operation of D-flip flop 13 as described in the behavioral table are eliminated. The remaining power vectors that are consistent with the operation of the sequential logic circuitry (D-flip flop 13) are used for a transistor level simulation of the circuit for calculating power dissipation.

Table 2 illustrates some of the power vectors generated for the remaining combinational logic circuitry illustrated in FIG. 2. The power vectors of Table 2 are compared against the behavioral table of a D-flip flop shown in Table 1. Power vectors that generate input and output responses that are not consistent with the operation of D-flip flop 13 of FIG. 1 are eliminated as indicated in Table 2. A complete listing of all power vectors is not indicated in Table 2 for brevity.

TABLE 2

| Row No | CLOCK | DI | Q | D | CK | Q1B | eliminate |
|--------|-------|----|---|---|----|-----|-----------|
| 1 | 0,1 | 1 | r | f | 0,1 | f | Yes |
| 2 | 0,1 | 1 | f | r | 0,1 | r | Yes |
| 3 | 0,1 | r | 1 | f | 0,1 | 0 | No |
| 4 | 0,1 | f | 1 | r | 0,1 | 0 | No |
| 5 | r | 0 | 0,1 | 1 | f | 0,1 | No |
| 6 | f | 0 | 0 | 1 | r | 1 | Yes |
| 7 | f | 0 | r | 1 | r | f | No |
| 8 | f | 0 | f | 1 | r | r | Yes |

In particular, D, CK, and Q logic levels generated by the power vectors are compared against D, CK, and Q logic levels indicated in Table 1. The vectors of row 1 and 2 are eliminated because D, CK, and Q logic levels are inconsistent with the operation of a D-flip flop since Q cannot change state unless there is a rising signal at CK. Vectors in rows 3 and 4 are consistent and not eliminated since they are both valid conditions (Q and CK do not change state). Row 5 is consistent with the operation of a D-flip flop since the signal CK is falling and the Q output does not transition. The vector in row 6 is eliminated due to the inconsistency in the rising clock signal at CK and the D input at a logic one level while the Q output remains at a logic zero level. The vector in row 7 is consistent with Table 1. The vector in row 8 is also eliminated for the same reason as that in row 6 because the final state of Q is 0 which is impossible as D is 1 and there is a rising signal at CK.

Further vector optimization is produced by compressing the representation of a dynamic power vector by introducing a "don't care signal". For example, two vectors (0,1,r,f) and (1,1,r,f) can be represented as (d,1,r,f) where d is a don't care signal since the vector does not depend on the first signal. This type of representation helps to reduce a computer memory requirement. The remaining power vectors (after culling out inconsistent vectors due to any sequential logic circuitry) form a power vector set that are used to calculate power dissipation of the circuit having both combinational and sequential logic circuitry.

In the preferred embodiment, a transistor level simulation is performed on a circuit having both combinational and sequential logic circuitry using the power vectors as input vectors for the simulation. The power dissipated during the application of each power vector is stored in a database. In the preferred embodiment, a library of circuits or cells are characterized in a similar fashion. Power estimates of a circuit can be calculated in a logic simulation if the circuit is formed from the library of cells. The inputs of each cell used in the circuit is monitored during logic simulation for a power vector corresponding to each cell. If a power vector for a cell occurs, the corresponding power dissipation is retrieved from the database for use in the power calculation. The total power dissipated by the circuit during the logic simulation is the sum of the power dissipation for each cell used in the circuit divided by the time of the simulation.

Figure 4:
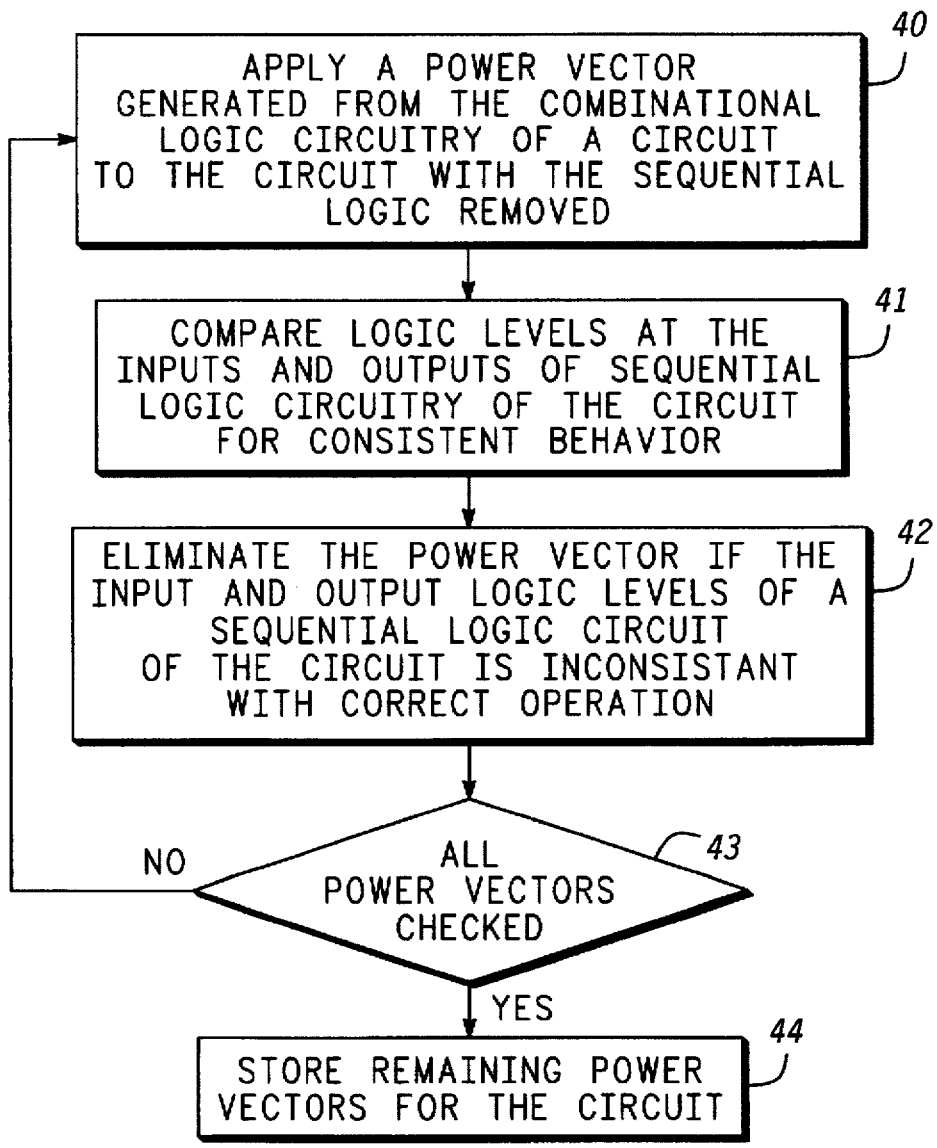
FIG. 4 is a flow diagram illustrating the removal of inconsistent power vectors for sequential logic elements of a circuit.

FIG. 4 is a flow diagram illustrating the further reduction of a power vector set due to the operating characteristics of any sequential logic circuitry in a circuit. In the preferred embodiment, the sequential logic circuitry is first removed from the circuit and a power vector set for the remaining combinational logic circuitry is generated as indicated in FIG. 3. The power vector set is stored in a database.

Step 40 applies a power vector from the power vector set to the circuit for simulation. The circuit has the sequential logic circuitry removed. Of particular interest in the simulation of the power vector are the logic levels at the nodes corresponding to the inputs and outputs of the sequential logic circuitry.

Step 41 compares logic levels at the nodes corresponding to the inputs and outputs of the sequential logic circuitry of the circuit for consistent behavior. In the preferred embodiment, the input and output logic levels are compared against a table or list of vectors corresponding to correct operation of the synchronous logic circuitry.

Step 42 eliminates the power vector if the input and output logic levels of the nodes corresponding to the nodes of the sequential logic circuitry of the circuit are inconsistent with correct operation.

Step 43 verifies if all power vectors have been compared for consistency of operation with the sequential logic circuitry.

Step 44 stores the remaining power vectors that have not been eliminated and are consistent with the operation of the sequential logic circuitry. The remaining power vectors constitute a power vector set suitable for simulating power dissipation of the circuit.

By now it should be appreciated that a method for generating a power vector set has been provided for a circuit having both sequential and combinational logic circuitry. Power vectors applied to the circuit cause a logic level transition that dissipates power. The sequential logic circuitry is removed from the circuit. Outputs of a sequential circuit become inputs to the combinational portion of the circuit. Inputs of a sequential circuit becomes outputs of the combinational portion of the circuit. A power vector set is generated for the combinational logic circuitry. In the preferred embodiment, Boolean functions describing the logical operation of the circuit at every output and internal node is generated. A Boolean difference function with respect to each input is then generated for each Boolean function. The Boolean difference functions are expressed as sum of product notation to isolate product terms. A logic 0 or 1 is assigned at each input (except the differential input) to make each product term evaluate to a logic one level and assign r or f at the differential input. The differential input is the one input that transitions. Each product term contributes to two dynamic power vectors. The Boolean difference operation is performed for each input. All redundant power vectors are removed. Power vectors are also optimized to obtain a concise representation and stored in a database.

The power vectors are culled of any vectors that are inconsistent with correct operation of the sequential circuitry. This is accomplished by examining the logic levels of the nodes corresponding to the inputs and outputs of the sequential logic circuitry due to each power vector and comparing them against a list or table that describes correct sequential logic circuitry operation. Any power vector is eliminated that produces logic levels that are inconsistent to the operation of any sequential circuitry of the circuit. A final step is to optimize the set of remaining vectors such that a concise list of vectors is generated for calculating power dissipation of the circuit having both combinational and sequential logic circuitry.

What is claimed is:

1. A method for generating complete power vectors for a circuit having combinational logic circuitry and sequential logic circuitry, the method comprising:

provided a netlist of the circuit;

removing sequential logic circuitry from the netlist of the circuit;

treating output nodes of the sequential logic circuitry as inputs of remaining combinational logic circuitry;

treating input nodes of the sequential logic circuitry as outputs of said remaining combinational logic circuitry; and generating power vectors for said remaining combinational logic circuitry, wherein said step of generating power vectors includes the steps of:

generating primitive power vectors that cause outputs of said remaining combinational logic circuitry to transition;

generating internal power vectors that cause internal nodes of said remaining combinational logic circuitry to transition without transitioning any of said outputs;

generating static power vectors for said remaining combinational logic circuitry wherein said primitive, internal, and static power vectors are generated using a logic simulation program;

characterizing operation of each sequential logic circuit of said sequential logic circuitry;

generating a list of operational characteristics for each sequential logic circuit of said sequential logic circuitry; and storing said list of operational characteristics of each sequential logic circuit of said sequential logic circuitry in a database.

2. The method as recited in claim 1 further including a step of producing a minimal set of power vectors from said primitive power vectors, said internal power vectors, and said static power vectors.

3. The method as recited in claim 1 further including the steps of:

performing a logic level circuit simulation of said remaining combinational logic circuitry with said power vectors; and storing logic levels at nodes corresponding to inputs and outputs of each sequential logic circuit of the circuit for each power vector.

4. The method as recited in claim 3 further including a step of comparing logic levels at nodes corresponding to inputs and outputs of each sequential logic circuit for each power vector against stored operational characteristics of each sequential logic circuit.

5. The method as recited in claim 4 further including the steps of:

eliminating power vectors that produce logic levels that are inconsistent with operational characteristics of the sequential logic circuitry at nodes corresponding to inputs and outputs of each sequential circuit; and storing remaining power vectors that are consistent with the operation of the sequential logic circuitry, said remaining power vectors forming a set of power vectors for calculating power dissipation of the circuit including both combinational logic circuitry and sequential logic circuitry.

6. A method for calculating power dissipation of a circuit having both combinational logic circuitry and sequential logic circuitry, the method comprising:

generating a library of cells, the library of cells including combinational logic circuits and sequential logic circuits;

forming the circuit from cells of said library of cells;

removing cells that are sequential logic circuits from a netlist of the circuit;

generating power vectors for remaining combinational logic circuitry wherein said step of generating power vectors includes the steps of:

simulating said remaining combinational logic circuitry with a logic simulation program;

exhaustively applying each input vector to said remaining combinational logic circuitry;

eliminating input vectors that do not produce a logic level transition at a node of said remaining combinational logic circuitry; and minimizing remaining vectors to yield a set of power vectors for said remaining combinatioal logic circuitry;

characterizing operation of said cells that are sequential logic circuits;

generating a list of operational characteristics for each sequential logic circuit; and storing said list of operational characteristics of each sequential logic circuit in a database.

7. The method as recited in claim 6 wherein said step of removing sequential logic circuitry of the circuit includes the steps of:

treating nodes corresponding to outputs of each sequential logic circuit as inputs of said remaining combinational logic circuitry; and treating nodes corresponding to inputs of each sequential logic circuit as outputs of said remaining combinational logic circuitry.

8. The method as recited in claim 7 wherein said step of generating power vectors for remaining combinational logic circuitry includes the steps of:

expressing said remaining combinational logic circuitry as Boolean functions; and using Boolean difference functions to determine power vectors that produce transitions at internal nodes and outputs of said remaining combinational logic circuitry.

9. The method as recited in claim 8 further including:

generating primitive power vectors that cause outputs of said remaining combinational logic circuitry to transition;

generating internal power vectors that cause internal nodes of said remaining combinational logic circuitry to transition without transitioning any of said outputs; and generating static power vectors for said remaining combinational logic circuitry.

10. The method as recited in claim 6 further including a step of comparing logic levels at nodes corresponding to inputs and outputs of each sequential logic circuit of the circuit generated by each power vector against corresponding operational characteristics of each sequential logic circuit in said database.

11. The method as recited in claim 10 further including the steps of:

eliminating power vectors that produce logic levels that are inconsistent with the operational characteristics of any sequential logic circuit of the circuit; and minimizing remaining power vectors to form a set of power vectors of the circuit for calculating power dissipation.

12. The method as recited in claim 10 further including the steps of:

simulating the circuit with said set of power vectors for calculating power dissipation using a transistor level simulation program; and storing a power dissipation value of the circuit for each power vector of said set of power vectors for calculating power dissipation in said database.

13. A method for generating power vectors for a circuit having both combinational logic circuitry and sequential logic circuitry, the method comprising:

removing sequential logic circuitry from a netlist of the circuit;

generating complete power vectors for remaining combinational logic circuitry of the circuit;

performing a logic level circuit simulation of said remaining combinational logic circuitry with said complete power vectors;

eliminating power vectors that do not produce a logic level transition at a node of said remaining combinational logic circuitry;

storing logic levels at nodes corresponding to inputs and outputs of each sequential logic circuit of the circuit for each power vector;

comparing logic levels at the nodes corresponding to inputs and outputs of each sequential logic circuit of the circuit generated by each power vector against corresponding operational characteristics of each sequential logic circuit; and further eliminating power vectors that produce logic levels inconsistent with correct operation of the sequential logic circuitry of the circuit wherein remaining power vectors form a set of power vectors for calculating power dissipation of the circuit.

* * * * *